Aug. 26, 1958 A. J. CERTA 2,849,296
ETCHING COMPOSITION AND METHOD
Filed Jan. 23, 1956
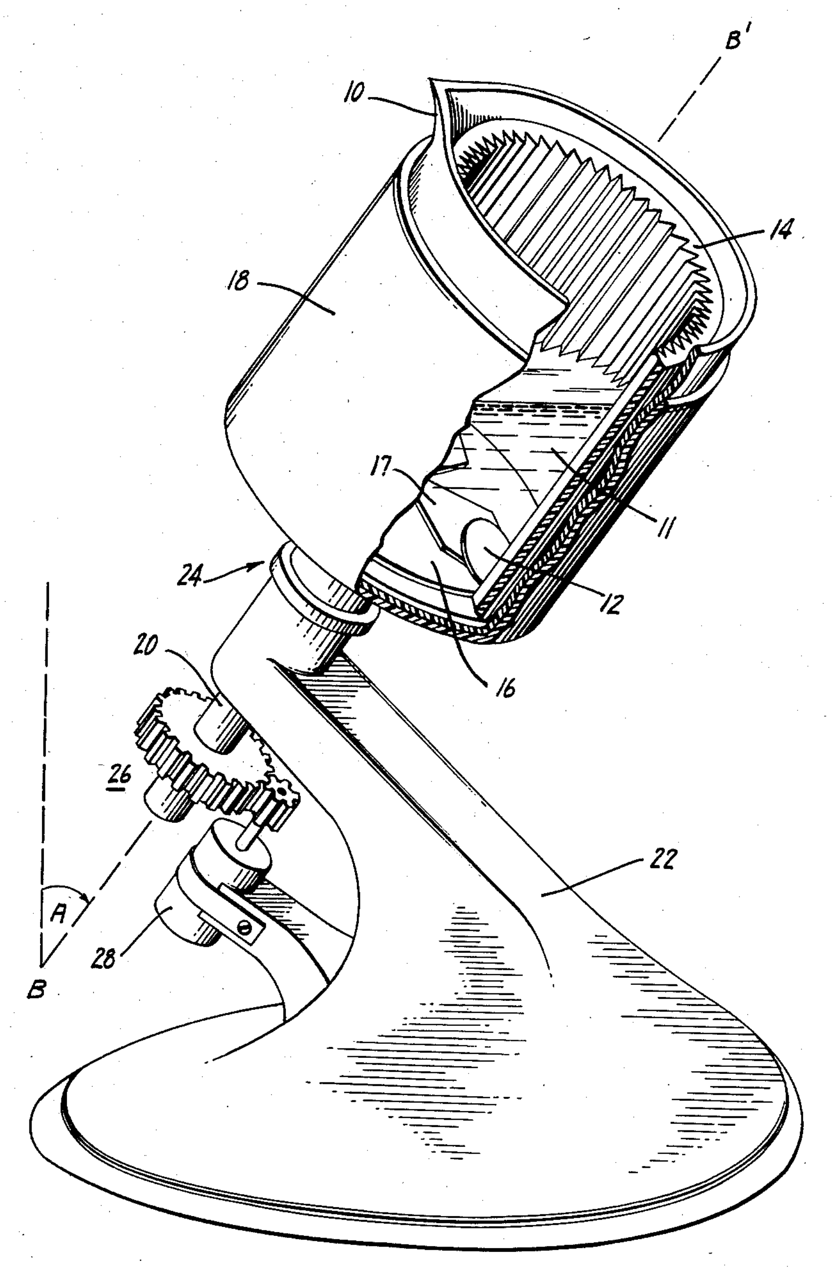
INVENTOR.
ANTHONY J. CERTA
BY
Owen U. Haydune
ATTORNEY United States Patent Office 2,849,296
Patented Aug. 26, 1958

2,849,296

ETCHING COMPOSITION AND METHOD

Anthony J. Certa, Bridgeport, Pa., assignor to Philco Corporation, Philadelphia, Pa., a corporation of Pennsylvania Application January 23, 1956, Serial No. 560,681
11 Claims. (Cl. 41—42)

The present invention relates to methods and compositions suitable for the etching of semiconductive materials, and particularly to methods and compositions for producing smooth, uniform, rapid and reproducible etching of germanium.

In the fabrication of semiconductive devices, it is often desirable to reduce the size of a semiconductive body by a chemical etching procedure. In many applications, it is important that such etching proceed smoothly, without producing pitting or roughening of the surfaces, and that it act substantially uniformly over the entire exposed semiconductor surface. Particularly where the process is to be used commercially, it is also important in many cases that the etching proceed at a relatively rapid rate, and preferably in a manner which is reproducible from time to time.

Such an etching procedure is of particular utility in the so-called size etching of semiconductive bodies intended for use in transistors or crystal diodes of certain types. For example, in fabricating high-frequency alloy-junction transistors or surface-barrier transistors, the provision of a thin blank of semiconductive material of reproducible thickness and plane-parallel major surfaces is often an important step in the fabrication procedure. In the case of the junction transistor, the provision of such a semiconductive blank facilitates the obtaining of extremely close spacing and a high degree of parallelism of the opposed collector and emitter junctions, producing improvements in alpha and high-frequency response; furthermore, this thickness should be constant for different bodies subjected to the same process, else optimum electrical characteristics may not be obtained or the devices may in fact be inoperative. In the case of the surface-barrier transistor, as made by jet-electrolytic processes for example, the provision of a blank having closely-spaced, plane-parallel opposed surfaces shortens the jet-etching time, improves progress of the jet-etching by assuring smooth electrolyte flow and normal incidence between jet and surface, and has the ultimate effect again of making possible improvements in alpha and/or high-frequency response of the completed device.

Not only should the above-mentioned small thickness of material be reproducibly obtainable, but the surfaces at which the emitter and collector barrier-forming processes are performed should be very smooth and free from pitting; lack of smoothness tends to result in irregular junctions in a junction transistor, and irregular and inferior collector and emitter barriers in the surface-barrier transistor, either of which effects may produce inferior electrical characteristics in the corresponding finished device.

Because of the small thicknesses of semiconductor material and the high level of smoothness of surface required, purely mechanical methods of sawing, grinding and polishing have generally been found impractical for the fabrication of bodies for use in devices of the above-described types. What has been found more feasible is to saw the original ingot into wafers about 20 mils in thickness, and then to subject the wafers to a chemical etching step to reduce their thickness further. Typically, the wafers may be reduced to a thickness of about 10 mils in this manner, ruled with a scriber, and broken up into blanks of areas appropriate for the ultimate products. After this, the individual blanks may be size etched further, typically to a thickness of less than 5 mils.

While chemical etchants and processes are known which will produce adequate etching of semiconductive bodies of crystalline germanium having the 1,1,0 crystal orientations, heretofore it has not been found possible to obtain satisfactory chemical etching of germanium in the 1,1,1 crystal orientation. In particular, known etchants have been found to produce rough, pitted surfaces, and usually to proceed at a relatively slow rate. Since crystals having the 1,1,1 orientation are useful in the fabrication of many semiconductive devices, and in particular have been found to produce distinct improvements in the characteristics of junction transistors made therefrom, the provision of an etching procedure which will permit attainment of the above-mentioned desirable characteristics when applied to 1,1,1-oriented material has been an important commercial objective. It is also commercially advantageous that the etchant be operative upon 1,1,0-oriented material as well, and that it produce its action upon the semiconductive material without generating large amounts of harmful fumes.

Accordingly, it is an object of my invention to provide an improved process and composition for accomplishing the etching of semiconductive materials.

Another object is to provide an improved composition and procedure for the size etching of germanium wafers.

Still another object is to provide such a procedure and composition which are particularly effective in accomplishing smooth etching of germanium material of the 1,1,1 crystal orientation.

A still further object is to provide an etching procedure and composition of the above-mentioned type which is rapid in its action, and produces etching at a rate which is reproducible without requiring close control of operating conditions.

A still further object is to provide a procedure and composition suitable for size etching a body of germanium having a 1,1,1 crystal orientation and having substantially plane-parallel opposed surfaces, so as to produce a corresponding wafer of smaller thickness and substantially plane-parallel surfaces free from pits and other roughnesses and imperfections.

A further object is to provide an etchant which will operate smoothly and rapidly upon both 1,1,1- and 1,1,0-oriented semiconductive materials.

Another object is to provide an improved etching composition and method which operate without generating excessive quantities of harmful fumes.

It is another object to provide an etching composition and method which are capable of etching-away semiconductive material at a substantially constant rate.

In accordance with the invention, the above objectives are achieved by the provision of an etchant having a composition found to result in greatly superior etching in respect of the above-mentioned desirable characteristics, and a method for utilizing this etchant to accomplish the desired type of etching. The etchant which I have discovered comprises a mixture of acetic acid, nitric acid, hydrofluoric acid and water in the hereinafter specified critical amounts. While other etchants are known in the art which include these elements in combination with other constituents and in different proportions, such etchants have been found not to provide the improved etching characteristics afforded by my novel etchant and described fully hereinafter. In its preferred form, the critically-constituted composition of the invention comprises 20 parts by volume of 99.8% glacial acetic acid, 15 parts by volume of 70% nitric acid, 10 parts by volume of 48% hydrofluoric acid and 3¼ parts by volume of water. The components of my new etchant are present in such critical quantities that they should be within about 1 part of the above-specified values in the case of the three acid components, and within about 1 and one-quarter parts in the case of water.

An etchant having this composition has been found excellent in its rapidity, uniformity and smoothness of action on a variety of semiconductive materials including germanium of a wide range of conductivities and minority-carrier lifetimes, and in particular produces extremely smooth and rapid etching of 1,1,1 crystal-oriented germanium, thereby greatly facilitating the fabrication of improved devices made from so-oriented material. Undesired generation of harmful fumes is also substantially nil, further facilitating commercial use of the etching procedure.

In accomplishing etching with the above-specified solution, I have found that constancy of etching rate during size etching of a wafer is improved by utilizing an elevated temperature for the etchant, and that the etching rate is also thereby increased substantially. A temperature of about 55° C. has been found to be preferable for this purpose, although other temperatures throughout the range from 45° C. to 65° C. are also highly satisfactory for many purposes. Preferably, agitation of the etchant is provided to expose all surfaces of the semiconductor substantially equally to the etchant and to permit the ready escape of any gases formed in the etching process. In a preferred embodiment, such agitation is provided by placing the etchant and semiconductor in a container having its axis inclined at an angle of between 30° C. and 45° C. from the vertical, and rotating the container about its axis during the etching step.

Other objects and features of the invention will become more apparent from a consideration of the following detailed description, taken in connection with the accompanying drawing which is a representation, in perspective and partly broken away, showing apparatus for practising the method of the invention in one of its preferred forms.

Since the invention has been found particularly useful for the size etching of germanium bodies in the course of fabricating transistors, and especially for the size etching of germanium wafers having the 1,1,1 crystal orientation, it will now be described with particular regard to its use in such applications.

In the course of fabrication of such transistors, and particularly those of the surface-barrier or alloyed-junction types, it is generally desirable to provide a thin wafer having substantially plane-parallel surfaces and composed of a semiconductive material such as germanium; for many purposes, the 1,1,1 crystal orientation has been found preferable. The provision of a smooth, unpitted surface on each side of the thin wafer is also usually an important requirement. To provide such a wafer, a roughly cylindrical ingot of germanium is first sawed into discs, and those discs having appropriate values of resistivity are then subjected to the size-etching procedure in accordance with the invention. Typically each wafer is substantially circular and initially about ¾ inch in diameter and 20 mils in thickness, with its opposed major surfaces substantially plane-parallel. In one typical production process, it is desired to reduce these wafers to a thickness of about 10 mils while maintaining the major surfaces substantially plane-parallel, and to produce a smooth and even mirror-like finish without substantial pitting. For obvious commercial reasons, it is also desired to accomplish this etching in as short a time as possible, and with such ready reproducibility that, by etching the wafers for a fixed, predetermined length of time, the desired thickness may be obtained with a tolerance of less than about 1 mil despite those fortuitous minor variations in environmental conditions and in the nature of the semiconductive material which are to be expected in commercial manufacturing processes.

To provide the desired etching, the novel etching solution of the invention may first be compounded by mixing together 20 parts by volume of glacial 99.8% acetic acid, 15 parts by volume of 70% nitric acid, 10 parts by volume of 48% hydrofluoric acid and 3¼ parts by volume of water. Commercial grades of the reagents have been found satisfactory, the water component preferably being distilled water. Since each of the reagents is in aqueous solution, the total amount of water in the mixture is the total of that in the reagents plus the specified added quantity. Accordingly, the desired etching solution may also be compounded by mixing together different quantities of reagents having strengths and water contents differing from those specified, so long as the same final composition is thereby produced.

The resultant solution is preferably heated to a temperature of about 55° C. by any suitable means, and for convenience a supply of the etchant sufficient to treat a number of wafers sequentially may be maintained at the specified temperature in a thermostatically-controlled, constant-temperature bath. Etching solution may then be drawn from this supply as it is needed.

The apparatus shown in Figure 1 for performing the etching process comprises a container 10 in the form of a beaker of an inert substance such as polyethylene, into which the above-described warm etchant 11 has been poured and the semiconductive wafer 12 placed. Preferably the amount of solution used is large compared to the volume of material to be etched away, so that the nature of the solution will not be altered greatly during the etching operation. Container 10 is provided with a removable, internally-corrugated sleeve member 14, proportioned to conform closely with the interior lateral surface of the container 10, and a removable disc 16, fitting loosely over the interior surface of the bottom of the container 10 and provided with four mutually-perpendicular vane-like raised portions such as 17. Sleeve member 14 and bottom disc 16 are suitably composed of an inert material such as Teflon, and serve primarily to enhance agitation of the etchant 11 and of the wafer 12 when container 10 is rotated. To this end, wafer 12 is preferably placed in container 10 so as to lie generally flat against bottom disc 16, as shown.

Rotation of container 10 about its longitudinal axis BB′ is accomplished in the present embodiment through the provision of a rotatable cup member 18 holding the container 10, and having integral therewith a concentric shaft 20, which in turn passes through and is supported by a supporting stand 22; appropriate bearing means 24 and gear means 26 are also provided to permit easy rotation of cup member 18 by motor 28. Rates of rotation of about 100 to 110 revolutions per minute are typical for this purpose.

To halt the etching when the desired thickness has been obtained, I prefer to remove the container 10 from its holder and to flush it out rapidly and thoroughly with distilled water. The wafer 12 may then be removed, and dried by a warm gas blast, or merely dipped in alcohol or methanol and air-dried. The container 10, holder 18, and driving shaft 20 are preferably maintained at an angle A of 30 to 45 degrees from the vertical, as indicated by the position of the axis BB′, so that the rotation mentioned above will provide the desired agitation and relative motion between electrolyte and wafer.

In one particular application of the invention utilizing the above-specified preferred composition, a solution temperature of 55° C., a circular wafer of N-type germanium of 1,1,1 crystal orientation, 1 ohm-centimeter resistivity, 100 microseconds minority-carrier lifetime, ¾″ diameter and an initial thickness of about 20 mils, size etching of the wafer to a thickness of about 10 mils was accomplished in about two minutes and 50 seconds, corresponding to a rate of thickness reduction of about 3½ mils per minute.

In this exemplary application, the wafer possessed plane-parallel major surfaces both before and after size etching. Furthermore, the etched surfaces were found to be of mirror-like smoothness substantially free of pitting and roughness, even though the germanium was of the 1,1,1 crystal orientation. Generating of harmful fumes during etching was also minimal.

Where the size-etched wafer 12 is to be utilized in surface-barrier or alloy-junction transistors, it may be scribed and broken up into smaller blanks, which in turn may be further size-etched in the manner and with the etchant described, to about 5 mils or less in thickness. Conventional fabrication procedures may then be employed to form emitter and collector elements and to affix a base connection to each blank.

With regard to the permissible range of proportions of my improved etching solution, I have found that objectionable pitting or roughening of the etched surfaces occurs if the amounts of any of the acids depart from the specified amounts in either direction by more than about one part by volume, or if the added water components departs from the specified amount by more than about 1¼ parts by volume. Thus, the amount of acetic acid should be between about 19 and 21 parts by volume, the nitric acid between about 14 and 16 parts by volume, the hydrofluoric acid between about 9 and 11 parts by volume and the water between 2 and 4½ parts by volume. Not only is smooth etching then obtained even for the 1,1,1 crystal orientation, but a high rate of etching is also achieved.

While the etching solution and progress of the invention are particularly advantageous for use with germanium of the 1,1,1 crystal orientation, they are of general utility in the etching of other orientations of germanium, and are also effective to etch other semiconductive materials such as silicon for example.

Although the theoretical basis for the improved etching action obtained with my critically-proportioned solution is not fully understood, the following considerations are believed to be involved and are presented without intending thereby to limit the scope of the invention. If only hydrofluoric acid and nitric acid in common solution were to be used as an etchant, they would tend to produce an action which would be rapid, but which would result in excessive gas evolution and substantial pitting of the etched surfaces. While the addition to this solution of water alone would tend to decrease the rate of gas evolution by decreasing the hydrogen-ion concentration, pitting would still occur to a substantial extent. However, by adding acetic acid not only is the desired reduction in hydrogen-ion concentration achieved but, because the acetic acid does not itself dissociate greatly, pitting is also substantially eliminated. In this manner, pitting and gas evolution are both minimized.

Although I have described the invention with regard to specific embodiments thereof, it will be understood that it is susceptible of embodiment in a variety of forms without departing from the scope thereof.

I claim:

1. An etchant substantially free of bromine for use on semiconductive materials, consisting essentially of about twenty parts by volume of glacial 99.8% acetic acid, about 15 parts by volume of 70% nitric acid, about 10 parts by volume of 48% hydrofluoric acid and about 3¼ parts by volume of water.

2. An etchant substantially free of bromine for use on crystalline germanium, consisting essentially of about 19 to 21 parts by volume of glacial 99.8% acetic acid, about 14 to 16 parts by volume of 70% nitric acid, about 9 to 11 parts by volume of 48% hydrofluoric acid and about 2 to 4½ parts by volume of water.

3. An etchant substantially free of bromine for use on germanium having a 1,1,1 crystal orientation, consisting essentially of about 19 to 21 parts by volume of glacial 99.8% acetic acid, about 14 to 16 parts by volume of 70% nitric acid, about 9 to 11 parts by volume of hydrofluoric acid, and about 2 to 4½ parts by volume of water, said etchant having a temperature of between 45° C. and 65° C.

4. A method of etching a body of semiconductive material, comprising immersing said body in an etchant substantially free of bromine and consisting essentially of about 19 to 21 parts by volume of glacial 99.8% acetic acid, 14 to 16 parts by volume of 70% nitric acid, 9 to 11 parts by volume of 48% hydrofluoric acid and 2 to 4½ parts by volume of water, and providing agitation of the solution about said body.

5. A method in accordance with claim 4, comprising the additional step of maintaining said etchant at a temperature between about 45° C. and 65° C. during said etching process.

6. A method in accordance with claim 4, comprising the additional step of maintaining said etchant at a temperature of about 55° C. during said etching step.

7. A method in accordance with claim 4, in which said agitation is provided by placing said etchant and said semiconductive body in a container having an irregular bottom, and rotating said container about an axis lying between horizontal and vertical.

8. A method in accordance with claim 7, in which said rotation is at a rate of about 100 revolutions per minute.

9. A method in accordance with claim 7, in which said axis of rotation is between 30° and 45° from the vertical.

10. The method of etching a body of semiconductive material, comprising applying to said body a solution substantially free of bromine and consisting essentially of about 19 to 21 parts by volume of glacial 99.8% acetic acid, 14 to 16 parts by volume of 70% nitric acid, 9 to 11 parts by volume of 48% hydrofluoric acid and 2 to 4½ parts by volume of water.

11. The method of etching a body of germanium having the 1,1,1 crystal orientation, comprising applying to said body a solution substantially free of bromine and consisting essentially of about 20 parts by volume of glacial 99.8% acetic acid, 15 parts by volume of 70% nitric acid, 10 parts by volume of 48% hydrofluoric acid and 3 parts by volume of water.

References Cited in the file of this patent

UNITED STATES PATENTS

| | | |
|---|---|---|
| 1,511,648 | Wennerblad et al. | Oct. 14, 1924 |
| 2,416,475 | Friedman | Feb. 25, 1947 |
| 2,619,414 | Heidenreich | Nov. 25, 1952 |